United States Patent
Sakurai et al.

(10) Patent No.: US 10,416,407 B2
(45) Date of Patent: Sep. 17, 2019

(54) OPTICAL COMMUNICATIONS DEVICE HAVING A PLATE-SHAPED FLEXIBLE PRINTED CIRCUIT WITH METALLIC PATTERN

(71) Applicant: Fujitsu Optical Components Limited, Kawasaki-shi, Kanagawa (JP)

(72) Inventors: Yuki Sakurai, Kawasaki (JP); Toshihiro Ohtani, Yokohama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 16/167,945

(22) Filed: Oct. 23, 2018

(65) Prior Publication Data
US 2019/0154942 A1 May 23, 2019

(30) Foreign Application Priority Data

Nov. 17, 2017 (JP) ................. 2017-222103

(51) Int. Cl.
*G02B 6/44* (2006.01)
*H05K 1/18* (2006.01)
*H04B 10/40* (2013.01)
*H05K 1/14* (2006.01)

(52) U.S. Cl.
CPC .......... *G02B 6/4478* (2013.01); *G02B 6/444* (2013.01); *H04B 10/40* (2013.01); *H05K 1/147* (2013.01); *H05K 1/189* (2013.01); *H05K 2201/09781* (2013.01); *H05K 2201/10121* (2013.01)

(58) Field of Classification Search
CPC ...... G02B 6/4478; G02B 6/444; H04B 10/40; H05K 1/189
See application file for complete search history.

(56) References Cited

U.S. PATENT DOCUMENTS

| | | | |
|---|---|---|---|
| 8,469,606 B2* | 6/2013 | Becht ................. | G02B 6/4246 29/428 |
| 2010/0183267 A1* | 7/2010 | Becht ................. | G02B 6/4246 385/88 |
| 2019/0154942 A1* | 5/2019 | Sakurai ............... | G02B 6/4478 |

FOREIGN PATENT DOCUMENTS

| | | |
|---|---|---|
| JP | 2004-133056 | 4/2004 |
| JP | 2006-10792 | 1/2006 |

OTHER PUBLICATIONS

Espacenet English abstract corresponding to Japanese Patent Publication No. 2004-133056, published Apr. 30, 2004.
Espacenet English abstract corresponding to Japanese Patent Publication No. 2006-10792, published Jan. 12, 2006.

* cited by examiner

*Primary Examiner* — Andrew Jordan
(74) *Attorney, Agent, or Firm* — Staas & Halsey LLP

(57) ABSTRACT

An optical communications device includes a support, a plate-shaped member, and an optical cable. The plate-shaped member is supported in a curved state on the support. The plate-shaped member is a flexible printed circuit including a flexible substrate and a metallic pattern formed on the flexible substrate. The optical cable is provided along a curved surface of the plate-shaped member on the support.

11 Claims, 13 Drawing Sheets

OPTICAL COMMUNICATIONS DEVICE HAVING A PLATE-SHAPED FLEXIBLE PRINTED CIRCUIT WITH METALLIC PATTERN

CROSS-REFERENCE TO RELATED APPLICATION

This application is based upon and claims the benefit of priority of the prior Japanese Patent Application No. 2017-222103, filed on Nov. 17, 2017, the entire contents of which are incorporated herein by reference.

FIELD

A certain aspect of the embodiments discussed herein is related to optical communications devices.

BACKGROUND

Extra length handling techniques that guide an extra length of an optical cable using a guide or the like in such a manner as to ensure the minimum allowable bend radius of the optical cable are known. (See, for example, Japanese Laid-open Patent Publication Nos. 2004-133056 and 2006-010792.)

SUMMARY

According to an aspect of the invention, an optical communications device includes a support, a plate-shaped member, and an optical cable. The plate-shaped member is supported in a curved state on the support. The plate-shaped member is a flexible printed circuit including a flexible substrate and a metallic pattern formed on the flexible substrate. The optical cable is provided along a curved surface of the plate-shaped member on the support.

The object and advantages of the embodiments will be realized and attained by means of the elements and combinations particularly pointed out in the claims.

It is to be understood that both the foregoing general description and the following detailed description are exemplary and explanatory and not restrictive of the invention.

DESCRIPTION OF EMBODIMENTS

According to the techniques discussed above in the background section, however, it is difficult to route an optical cable in such a manner as to ensure a radius larger than or equal to the minimum allowable bend radius of the optical cable in a limited space inside optical communications devices. In recent years, because of a rapid increase in internal mounting density caused by reduction in device size, an available space inside optical communications devices has become limited.

According to an aspect, it is possible to route an optical cable in such a manner as to ensure a radius larger than or equal to the minimum allowable bend radius of the optical cable in a limited space inside optical communications devices.

Preferred embodiments of the present invention will be explained with reference to accompanying drawings.

[a] First Embodiment

Figure 1:
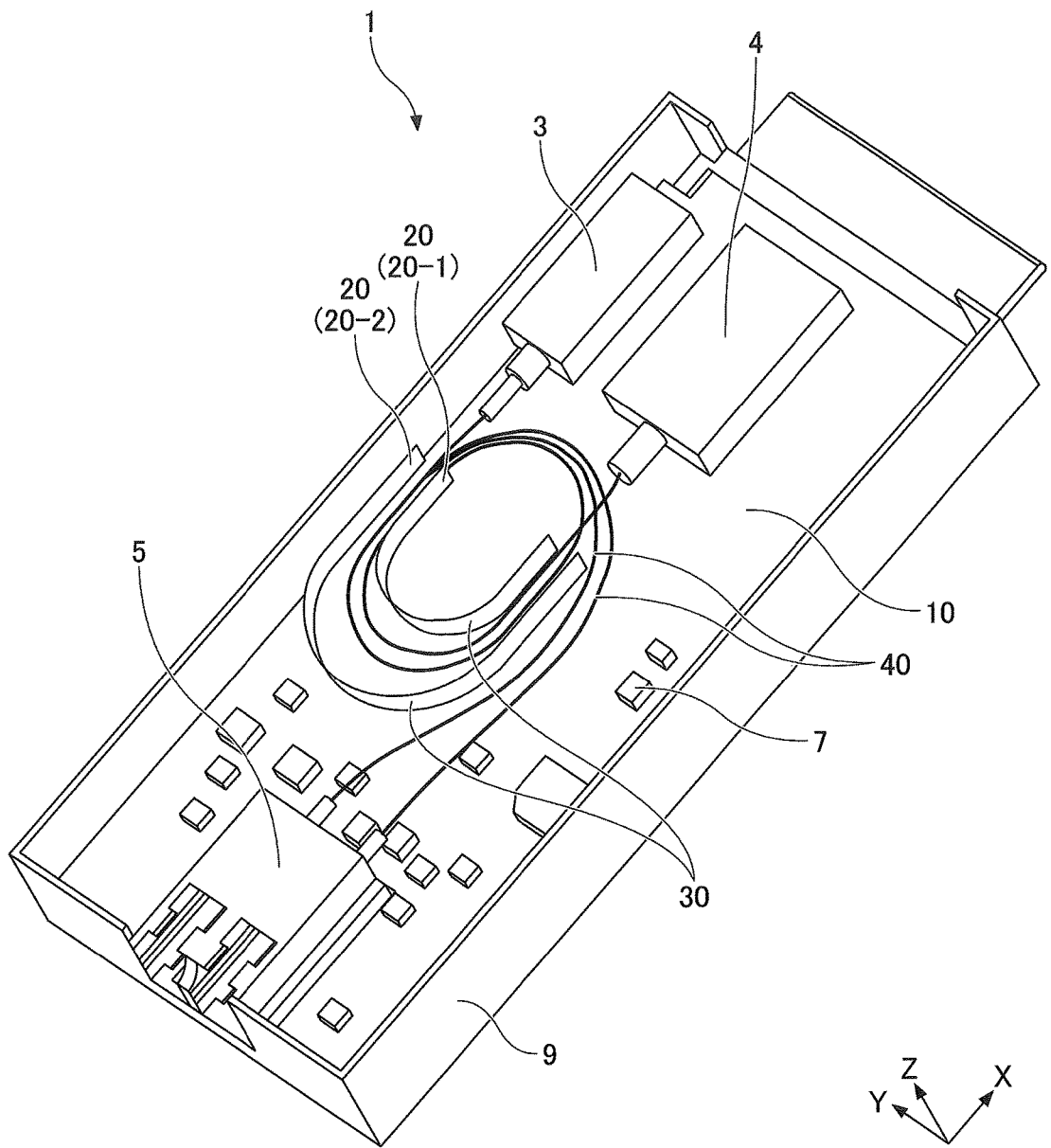
FIG. 1 is a perspective view of an optical transceiver according to a first embodiment, illustrating an internal structure thereof.

FIG. 1 is a perspective view of an optical transceiver 1 (an optical communications device) according to a first embodiment, illustrating an internal structure of the optical transceiver 1. In FIG. 1, an upper part of a housing is not depicted to illustrate the internal structure. In FIG. 1, an X-direction, a Y-direction, and a Z-direction are illustrated as three orthogonal directions. In the following, for convenience of description, the Z-direction is regarded as an upward direction, and a side, position, object or the like that is in the Z-direction relative to another is referred to using a term associated with the upward direction, such as "upper." The optical transceiver 1 in which components are installed, however, may be in any orientation.

The optical transceiver 1 is a device for converting an electrical signal and an optical signal into each other. The optical transceiver 1 is installed in an optical transport apparatus for optical communications (not depicted). In addition to the optical transceiver 1, one or more devices may be installed in the optical transport apparatus.

The optical transceiver 1 includes a housing 9, a printed board 10 (a support), a plate-shaped member 20, and optical cables 40 (hereinafter collectively referred to as "optical cable 40").

The housing 9 includes an upper housing part (not depicted) and a lower housing part. An internal space defined by the housing 9 forms a space inside the optical transceiver 1. The printed board 10, etc., are accommodated in the space inside the optical transceiver 1.

The printed board 10 is, for example, a solid printed board. Parts 3 and 4 connected by the optical cable 40, a peripheral part 7, etc., are mounted on the printed board 10. In the illustration of FIG. 1, the parts 3 and 4 are optical devices. A part 5 is an optical connector (input connector) mounted on the housing 9. The plate-shaped member 20 is provided on the printed board 10.

The plate-shaped member 20 serves to prevent a bend radius smaller than the minimum allowable bend radius of the optical cable 40. The plate-shaped member 20 is in the form of a flexible plate, and is supported in a curved state on the printed board 10. The plate-shaped member 20 may be fixed onto the printed board 10 using, for example, solder, an adhesive, or adhesive tape. According to the first embodiment, by way of example, solder is used as described below.

The plate-shaped member 20 forms a curved surface 30. The curved surface 30 is in the form of an arc when viewed in the Z direction. The radius of curvature of the plate-shaped member 20 (namely, the radius of curvature of the curved surface 30) is determined to be larger than or equal to the minimum allowable bend radius of the optical cable 40 so as to ensure a bend radius larger than or equal to the minimum allowable bend radius. The radius of curvature of the plate-shaped member 20 does not have to be constant, and may vary in a circumferential direction. Ensuring a bend radius larger than or equal to the minimum allowable bend radius of the optical cable 40 means ensuring that the bend radius of the optical cable 40 is larger than or equal to the minimum allowable bend radius. The plate-shaped member 20 may be provided in the form of a pair of plate-shaped members as illustrated in FIG. 1. In the following, the plate-shaped member 20 may also be referred to as "plate-shaped members 20-1 and 20-2" when a distinction is made between the individual plate-shaped members.

The bend radius of the plate-shaped member 20-1 is smaller than the bend radius of the plate-shaped member 20-2. The respective curved shapes of the plate-shaped members 20-1 and 20-2, which are concentric according to this embodiment, may be eccentric as a variation. In the following, the term "radial direction" refers to a radial direction from the center of curvature of the plate-shaped member 20-2. A space for routing the optical cable 40 is defined between the plate-shaped members 20-1 and 20-2 in the radial direction. In this case, when the optical cable 40 is routed between the plate-shaped members 20-1 and 20-2 in the radial direction, the bend radius of the optical cable 40 is prevented from becoming smaller than the bend radius of the plate-shaped member 20-1 as schematically illustrated in FIG. 1. That is, a bend radius larger than or equal to the minimum allowable bend radius of the optical cable 40 is ensured. Furthermore, when the optical cable 40 is routed between the plate-shaped members 20-1 and 20-2 in the radial direction, the bend radius of the optical cable 40 is prevented from becoming larger than the bend radius of the plate-shaped member 20-2. That is, the plate-shaped member 20-2 serves to restrict an outward movement of the optical cable 40 with respect to the radial direction. As a variation, the plate-shaped member 20-2 may be omitted. That is, the plate-shaped member 20 may be provided only on the side on which it is possible to prevent a bend radius smaller than the minimum allowable bend radius of the optical cable 40.

The optical cable 40 is, for example, a cable in which an optical fiber is provided with a sheath (protective cover), and transmits an optical signal. The optical cable 40 is connected between parts in the optical transceiver 1. In the illustration of FIG. 1, the optical cable 40 is routed in such a manner as to connect the parts 3, 4 and 5. The optical cable 40 may be routed as desired. In other words, the placement (including the form of curvature) of the plate-shaped member 20 is determined in accordance with the route of the optical cable 40.

The optical cable 40 is provided along the curved surface 30 of the plate-shaped member 20 on the printed board 10. Here, "being provided on the printed board 10" does not require the optical cable 40 to contact the printed board 10, and allows the optical cable 40 to be slightly spaced from the printed board 10. Furthermore, "being provided along the curved surface 30 of the plate-shaped member 20" does not require contact with the curved surface 30 and allows a slight distance from the curved surface. For example, referring to FIG. 1, the optical cable 40 is provided along the curved surface 30 (the outer surface in the radial direction) of the plate-shaped member 20-1. While illustrated as being spaced from the curved surface 30 of the plate-shaped member 20-1 in FIG. 1, the optical cable 40 may alternatively be wound on the curved surface 30 of the plate-shaped member 20-1.

Figure 2:
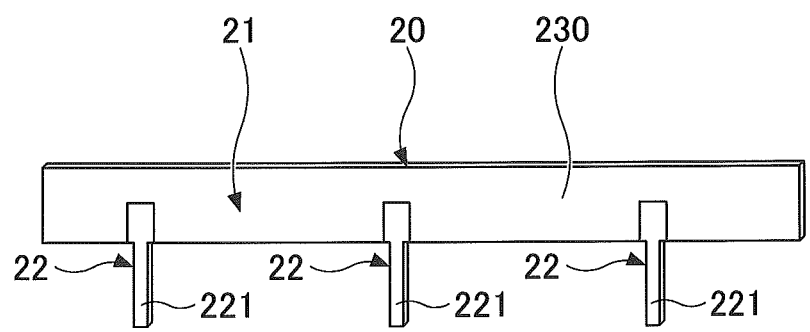
FIG. 2 is a schematic diagram illustrating a plate-shaped member in a straightened state according to the first embodiment.

FIG. 2 is a schematic diagram illustrating the plate-shaped member 20 in a straightened (unbent) state.

The plate-shaped member 20 takes the form of a flexible printed circuit (FPC). For example, the plate-shaped member 20 includes a substrate 230 (such as polyimide) of an FPC and a metallic pattern (such as a copper pattern) formed on the substrate 230. The metallic pattern may be provided on either one or both sides of the substrate 230. Furthermore, one or more substrates and one or more metallic patterns may be alternately layered (into, for example, a stack of a substrate, a metallic pattern, a substrate, and a metallic pattern) to form the plate-shaped member 20. Alternatively, a stack of a substrate and a metallic pattern may be combined with another one or more stacks of a substrate and a metallic pattern to form the plate-shaped member 20. Furthermore, the plate-shaped member 20 may be in the form of an FPC including a copper clad laminate (CCL), a coverlay (CL), and an adhesive sheet. In addition to polyimide, nonmetallic materials including other resin materials such as polyethylene terephthalate (PET), liquid crystal materials, and other polymer materials may be used as the substrate 230.

The plate-shaped member 20 includes a body 21 and fixation parts 22.

The body 21 has a strip shape that defines a longitudinal direction of the plate-shaped member 20. The body 21 is curved to define the above-described curved surface 30.

The fixation parts 22 extend downward from the body 21. The fixation parts 22 are fixed to the printed board 10 by, for example, soldering as described below, thereby supporting the plate-shaped member 20 on the printed board 10.

The number of fixation parts 22 is, for example, two or more. Alternatively, as a variation, the plate-shaped member 20 may have a ring shape with a single fixation part 22. The fixation parts 22 are provided at different positions on the body 21 along its longitudinal direction. By providing two or more fixation parts 22, it is possible to keep the plate-shaped member 20 curved. In the illustration of FIG. 2, three fixation parts 22 are provided.

Preferably, the fixation parts 22 are not provided at the longitudinal ends of the body 21. As a result, the longitudinal ends of the body 21 become free ends to have high flexibility. The optical cable 40 is likely to contact the longitudinal ends of the body 21. Therefore, by providing the longitudinal ends of the body 21 with high flexibility, it is possible to minimize damage to the optical cable 40.

Preferably, the fixation parts 22 are at least part of a portion of the substrate 230 where the metallic pattern is formed. In this case, the metallic pattern may be formed on part or the entirety of each fixation part 22. When the fixation parts 22 include the metallic pattern, it is possible to fix the plate-shaped member 20 to the printed board 10 by soldering. In the illustration of FIG. 2, a metallic pattern 221 is formed on the entirety of each fixation part 22, and extends onto the body 21 from the fixation parts 22. As a variation, the metallic pattern 221 may be formed only on the fixation parts 22.

Here, the metallic pattern of the plate-shaped member 20 does not form an electrical circuit. That is, the plate-shaped member 20 is not used for what the FPC is supposed to be used for. The metallic pattern on the fixation parts 22 is formed for the below-described soldering. Furthermore, a conductive pattern that may be included in the body 21 is formed to adjust the elastic properties of the plate-shaped member 20 at the time of its curving. The metallic pattern that may be included in the body 21 may be electrically grounded to serve as an electromagnetic shield, for example.

Figure 3:
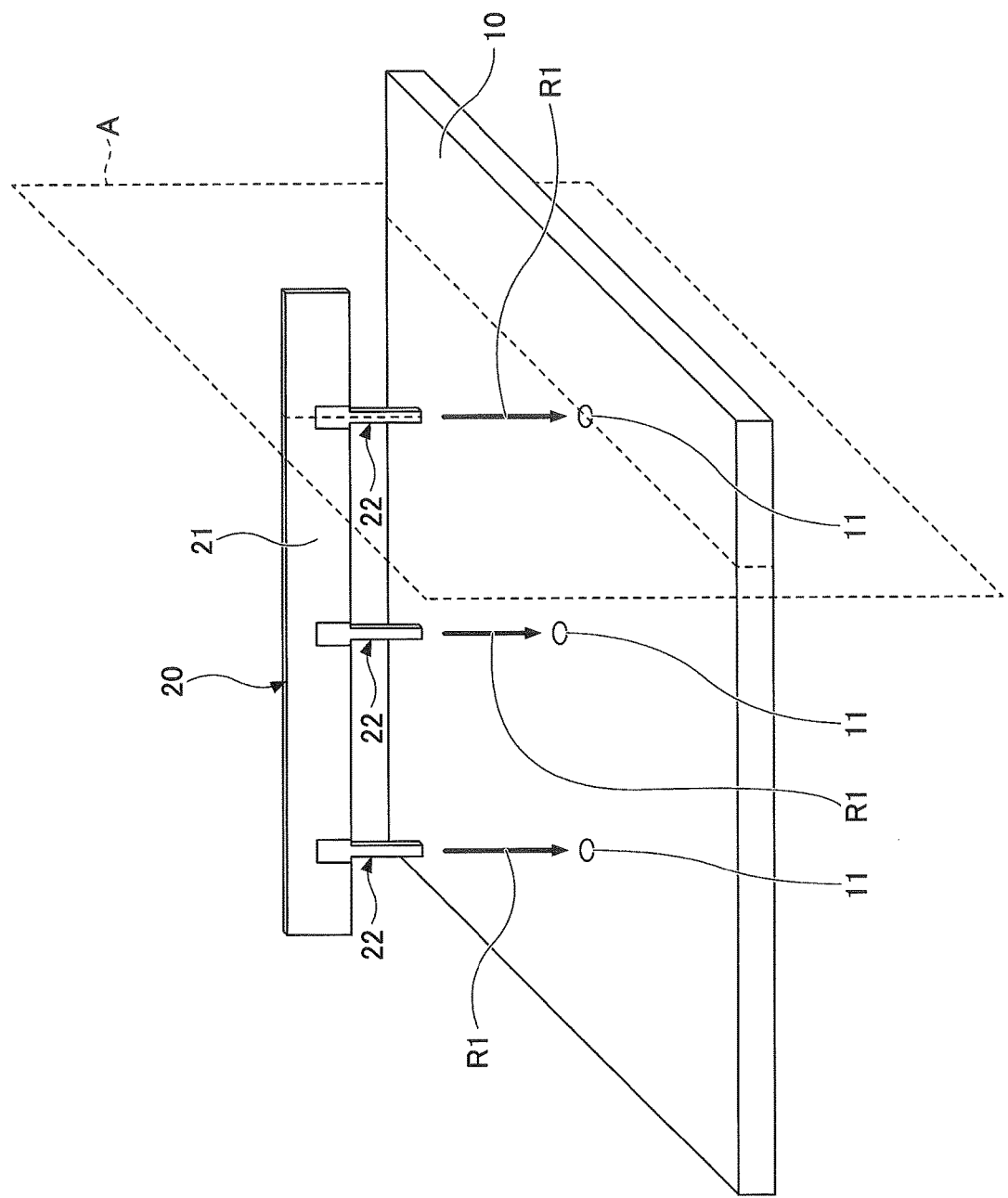
FIG. 3 is a diagram illustrating a method of fixing the plate-shaped member to a printed board according to the first embodiment.
Figure 4:
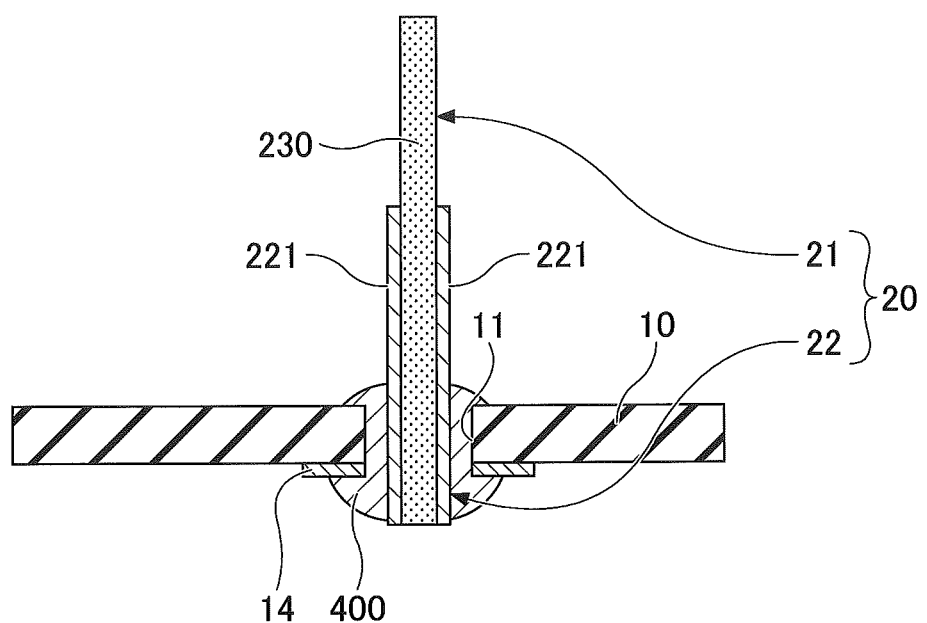
FIG. 4 is a sectional view of the plate-shaped member and the printed board in a fixed state according to the first embodiment.

FIG. 3, which is a diagram illustrating a method of fixing the plate-shaped member 20 to the printed board 10, is a perspective view of the printed board 10 and the plate-shaped member 20 before fixation of the plate-shaped member 20 to the printed board 10. FIG. 4 is a sectional view of the plate-shaped member 20 and the printed board 10 in a fixed state, taken along the plane A of FIG. 3. Here, the case where the plate-shaped member 20 is curved in a manner different from that illustrated in FIG. 1 is illustrated for description.

The printed board 10 has holes 11 at multiple positions along the arc of the curved surface 30 of the plate-shaped member 20. In the illustration of FIG. 3, the number of holes 11 is three.

The fixation parts 22 of the plate-shaped member 20 are fitted (inserted) into the holes 11 (as indicated by the arrows R1 in FIG. 3). That is, the fixation parts 22 are in the form of protrusions that are fitted into the holes 11. Preferably, the fixation parts 22 are fitted into the holes 11 such that the fixation parts 22 do not protrude upward from the holes 11. That is, preferably, the fixation parts 22 are entirely inserted lengthwise through the holes 11 such that the lower end of the body 21 vertically contacts the printed board 10. The fixation parts 22 are formed at positions corresponding to the holes 11. That is, the pitch of the holes 11 arranged along the arc of the curved surface 30 of the plate-shaped member 20 is substantially equal to the pitch of the fixation parts 22. Accordingly, when the fixation parts 22 of the plate-shaped member 20 are fitted into the holes 11, the plate-shaped member 20 is curved with a radius of curvature corresponding to an arc connecting the holes 11.

As schematically illustrated in FIG. 4, the fixation parts 22 are soldered to the printed board 10 while being fitted into the holes 11. Solder 400 is schematically illustrated in FIG. 4. A conductor part 14 may be formed on the printed board 10 for soldering.

To address a rapid increase in internal mounting density caused by reduction in module size, the forming (routing work) of an optical cable by small-radius bending (bending the optical cable into a small radius) is useful.

According to high-density mounting, a bend radius (a minimum bend radius) is managed in small-radius bending. As the bend radius of an optical cable decreases, the optical loss and the fracture probability of the optical cable sharply increase. Therefore, it is desired to form the optical cable with a bend radius larger than or equal to a prescribed bend radius (minimum allowable bend radius). In recent years, with rapid progress in the downsizing of optical modules, the bend radius of an optical cable as designed for mounting in optical modules such as the optical transceiver 1 has approximated the prescribed minimum allowable bend radius of the optical cable. Therefore, the bend radius of the optical cable may be smaller than its minimum allowable bend radius because of variations in manufacturing work.

Conventional optical modules employ a fiber tray or a forming support part (holding only part of an arc-shaped region of a wound optical cable) as a structure for ensuring a bend radius larger than or equal to the minimum allowable bend radius of an optical cable. Common fiber trays are manufacturing by molding or cutting a resin material. The manufactured products, however, require a minimum thickness of 0.5 mm or more and require screws or double-sided tape to be fixed inside a module, thus occupying a large space for mounting inside the module.

Forming support parts, which are aimed at saving and making efficient use of space for mounting for reducing size and thickness, are often manufactured by performing contour cutting and bending on a metallic or resin sheet material, and the manufactured products can be reduced in thickness to approximately 0.1 mm to approximately 0.2 mm. Like fiber trays, however, common forming support parts are fixed using screws or double-sided tape, and cannot be reduced in overall size. Furthermore, because thickness reduction is achieved by, for example, performing wire cutting or blanking using a press die on a metallic sheet material (hereinafter referred to as "sheet metal"), edges of the parts may include burrs or turns (slight bending of the edges in a direction opposite to a direction in which blanking is performed) to do damage to the formed optical cable. Furthermore, according to a structure where an optical cable is held at part of (multiple points on) an arc-shaped route into which the optical cable is formed, because of variations in work during fiber forming, the bend radius of the optical cable may be locally reduced temporarily or permanently (the optical cable may be angularly bent in the worst case) to be smaller than the minimum allowable bend radius.

When the bend radius of the optical fiber temporarily becomes smaller than the minimum allowable bend radius, no abnormality in properties is observed if the bend radius thereafter returns to a bend radius larger than or equal to the minimum allowable bend radius. Depending on the circumstances, however, a seed for the breakage of the optical fiber may be created and thereafter developed into actual breakage during use. Furthermore, when fiber forming is performed with the bend radius of the optical fiber being permanently smaller than the minimum allowable bend radius, the optical loss of the optical fiber may increase to degrade the properties of the optical module. In addition, when the bend radius of the optical fiber is kept smaller than the minimum allowable bend radius for a long time, the breakage of the optical fiber may progress.

To solve these problems, changes such as a change in the method of processing materials, a change in mounting structure in a module, and a change in a manufacturing method such as fiber forming are required, thus increasing cost.

In contrast, according to the first embodiment, by using the plate-shaped member 20 in the form of an FPC, it is possible to route (perform fiber forming of) the optical cable 40 such that a bend radius larger than or equal to the minimum allowable bend radius of the optical cable 40 is ensured in a limited space inside the optical transceiver 1. That is, the plate-shaped member 20, which is in the form of a thin plate, does not take up a large space. Furthermore, the plate-shaped member 20, which is flexible and bendable, can be fixed to the printed board 10 in a curved state. In this case, the plate-shaped member 20 can form the curved surface 30 that can restrict the bend radius of the optical cable 40. The curved surface 30, which has a radius of curvature larger than the minimum allowable bend radius, can keep the bend radius of the optical cable 40 provided along the curved surface 30 larger than or equal to the minimum allowable bend radius.

Furthermore, according to the first embodiment, the plate-shaped member 20 can be formed using the same material and manufacturing method as the FPC. Therefore, according to the plate-shaped member 20, it is easy to reduce thickness, and no burrs that would be generated in the case of sheet metal are generated. Furthermore, the plate-shaped member 20, which includes the metallic pattern 221, can be soldered to the printed board 10 using the metallic pattern 221. This makes it possible to firmly fix the plate-shaped member 20 in a space-saving manner.

In addition, according to the first embodiment, the plate-shaped member 20, which can be formed using the same material and manufacturing method as the FPC, has the same deflection characteristics as the FPC. For example, the FPC has the characteristic of returning to its original (rectilinear) condition when being bent. Accordingly, even when the curvature of the plate-shaped member 20 temporarily becomes smaller than the minimum allowable bend radius because of variations in work, local stress is immediately dispersed in a circumferential direction. That is, the curvature smaller than the minimum allowable bend radius is easy to eliminate, and the effect that the plate-shaped member 20 can be naturally restored in such a manner as to approach its original shape, can be expected.

Moreover, according to the first embodiment, the plate-shaped member 20 can be formed using the same material and manufacturing method as the FPC. Therefore, it is easy to change the positions of the fixation parts 22 (namely, increase variations). It is also easy to change the positions of the holes 11 in the printed board 10 (namely, increase variations). Thus, according to the first embodiment, it is possible to easily accommodate various fiber forming paths (arc-shaped routes).

Furthermore, according to the first embodiment, the plate-shaped member 20 can be formed using the same material and manufacturing method as the FPC. Therefore, it is easy to change the size (length and width) of the plate-shaped member 20 (namely, increase variations). This makes it possible to easily adapt to various routing methods.

[b] Second Embodiment

A second embodiment is different from the above-described first embodiment in the method of fixing a plate-shaped member to the printed board 10. In the following description of the second embodiment, elements that may be the same as those of the first embodiment are referred to using the same reference numerals, and their description may be omitted.

Another method of fixing a plate-shaped member to the printed board 10 is described with reference to FIGS. 5 and 6.

Figure 5:
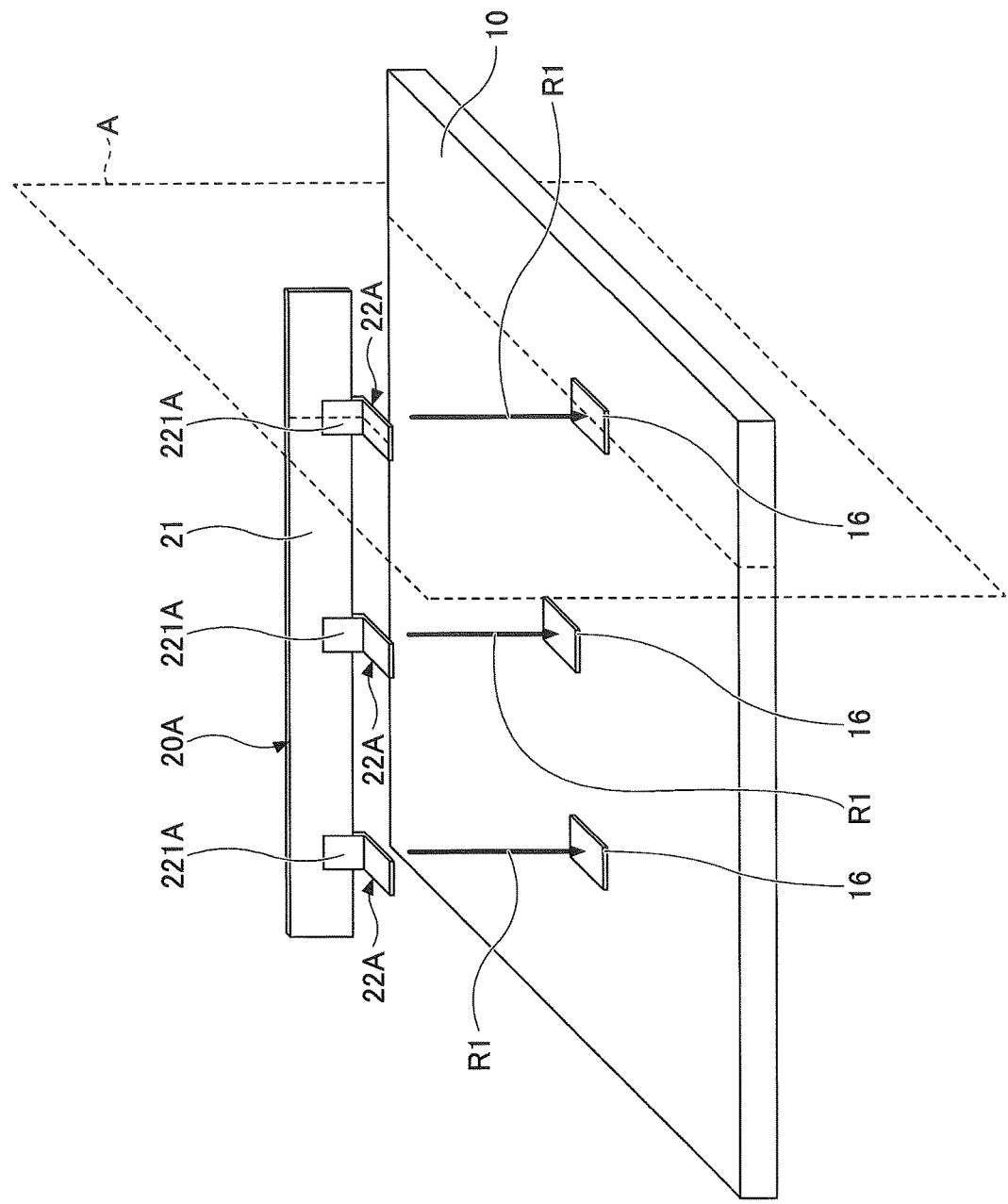
FIG. 5 is a diagram illustrating a method of fixing a plate-shaped member to the printed board according to a second embodiment.

FIG. 5 is a diagram illustrating a method of fixing a plate-shaped member 20A to the printed board 10. FIG. 6 is a sectional view of the plate-shaped member 20A and the printed board 10 in a fixed state, taken along the plane A of FIG. 5. Here, the case where the plate-shaped member 20A is curved in a manner different from that of the plate-shaped member 20 illustrated in FIG. 1 is illustrated for description.

The plate-shaped member 20A includes the body 21 and fixation parts 22A. The same as in the above-described first embodiment, the plate-shaped member 20A is formed of an FPC.

The fixation parts 22A extend radially inward, namely, extend inward with respect to the radial direction of the plate-shaped member 20A, from the lower end of the body 21. The fixation parts 22A, however, may extend radially outward, namely, extend outward with respect to the radial direction of the plate-shaped member 20A. The fixation parts 22A may be formed by bending protrusions formed at the lower end of the substrate 230. A metallic pattern 221A is formed on the entirety of each fixation part 22A, and extends onto the body 21 from the fixation parts 22A.

The printed board 10 includes fixation pads 16 at multiple positions along the arc shape of the curved surface 30. In the illustration of FIG. 5, the number of fixation pads 16 is three. The fixation pads 16 may be formed of a metallic material.

The fixation parts 22A of the plate-shaped member 20A vertically contact the fixation pads 16 (as indicated by the arrows R1 in FIG. 5). That is, the fixation parts 22A can contact the fixation pads 16. The fixation parts 22A are formed at positions corresponding to the fixation pads 16. That is, the pitch of the fixation pads 16 arranged along the arc of the curved surface 30 is substantially equal to the pitch of the fixation parts 22A. Accordingly, when the fixation parts 22A of the plate-shaped member 20A are in contact with the fixation pads 16, the plate-shaped member 20A is curved with a radius of curvature corresponding to an arc connecting the fixation pads 16.

Figure 6:
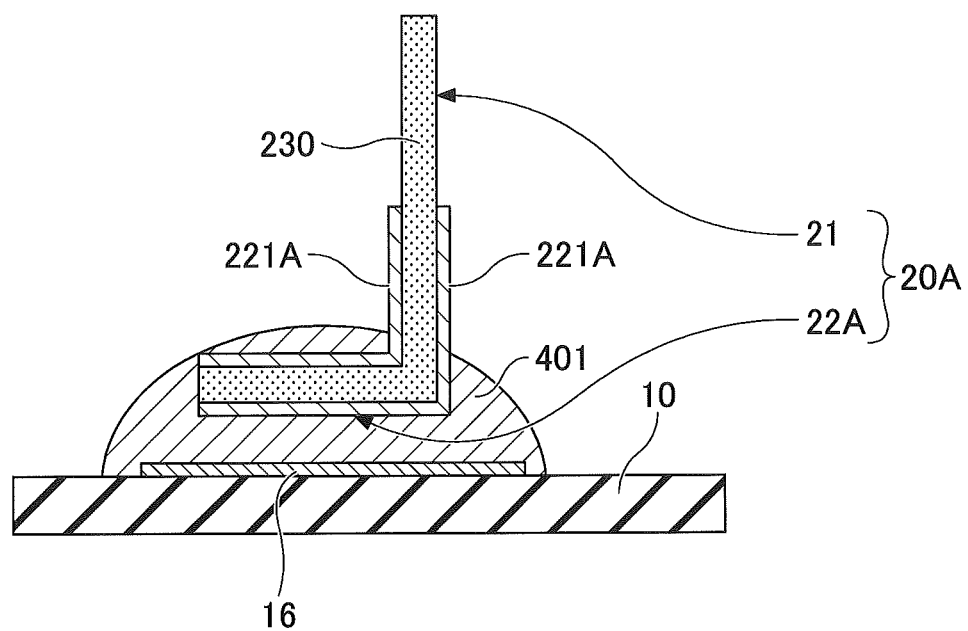
FIG. 6 is a sectional view of the plate-shaped member and the printed board in a fixed state according to the second embodiment.

As schematically illustrated in FIG. 6, the fixation parts 22A are soldered to the fixation pads 16 while contacting the fixation pads 16. Solder 401 is schematically illustrated in FIG. 6.

The same effects as achieved by the above-described first embodiment can be achieved by the second embodiment as well.

[c] Third Embodiment

A third embodiment is different from the above-described first embodiment in the method of fixing a plate-shaped member to the printed board 10. In the following description of the third embodiment, elements that may be the same as those of the first embodiment are referred to using the same reference numerals, and their description may be omitted.

Another method of fixing a plate-shaped member to the printed board 10 is described with reference to FIGS. 7 through 9.

Figure 7:
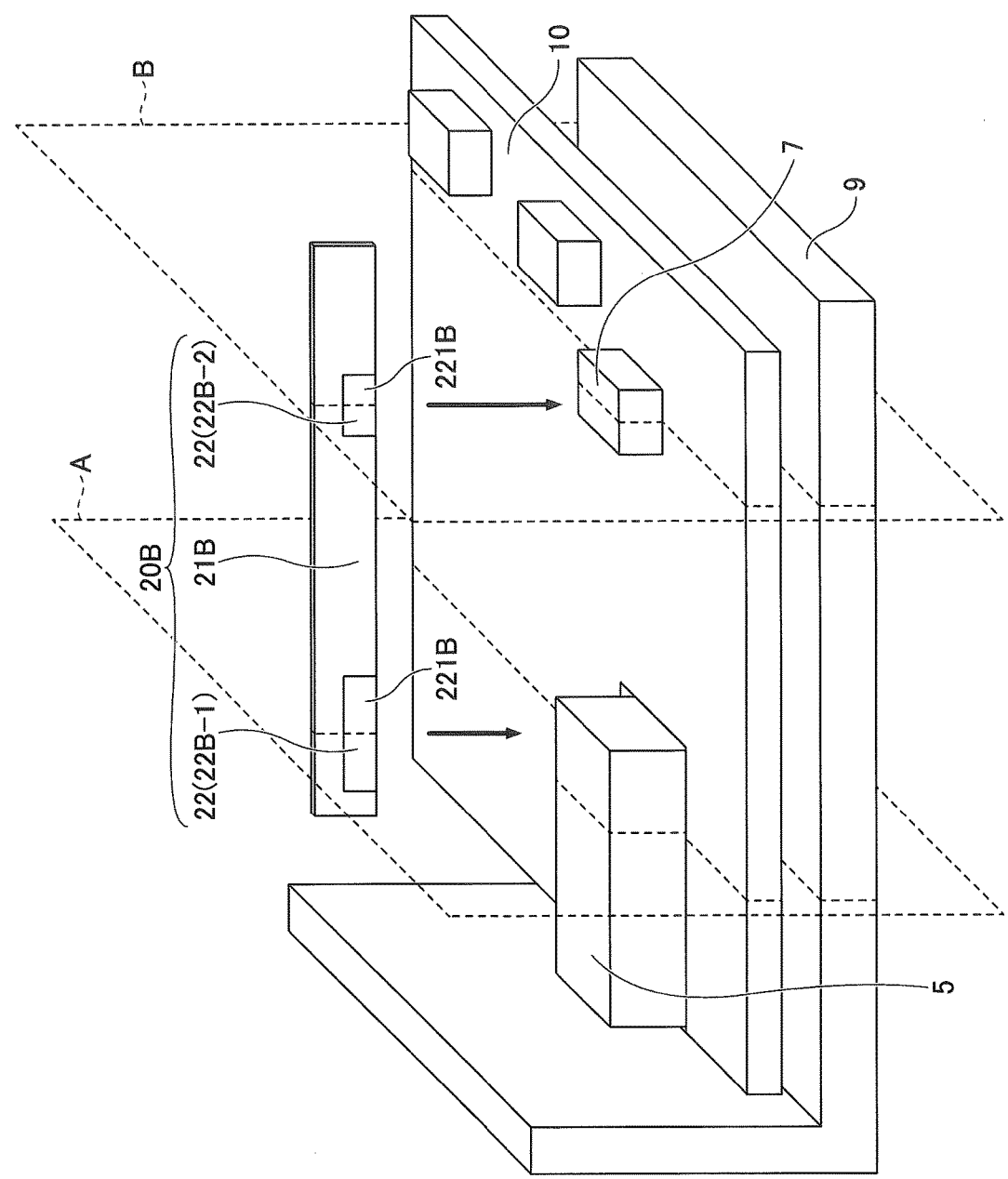
FIG. 7 is a diagram illustrating a method of fixing a plate-shaped member to the printed board according to a third embodiment.

FIG. 7 is a diagram illustrating a method of fixing a plate-shaped member 20B to the printed board 10. FIG. 8 is a sectional view of the plate-shaped member 20B and the printed board 10 in a fixed state, taken along the plane A of FIG. 7. FIG. 9 is a sectional view of the plate-shaped member 20B and the printed board 10 in the fixed state, taken along the plane B of FIG. 7. Here, the case where the plate-shaped member 20B is curved in a manner different from that of the plate-shaped member 20 illustrated in FIG. 1 is illustrated for description.

The plate-shaped member 20B includes a body 21B and fixation parts 22B. The body 21B is the same as the body 21 of the above-described first embodiment except for including the fixation parts 22B. The plate-shaped member 20B is formed of an FPC the same as in the first embodiment.

The fixation parts 22B are formed in part of a lower portion of the plate-shaped member 20B. A metallic pattern 221B is formed on the entirety of each fixation part 22B. The number of fixation parts 22 is, for example, two. In the following, the fixation parts 22B are referred to as "fixation part 22B-1" and "fixation part 22B-2" for distinction.

Figure 8:
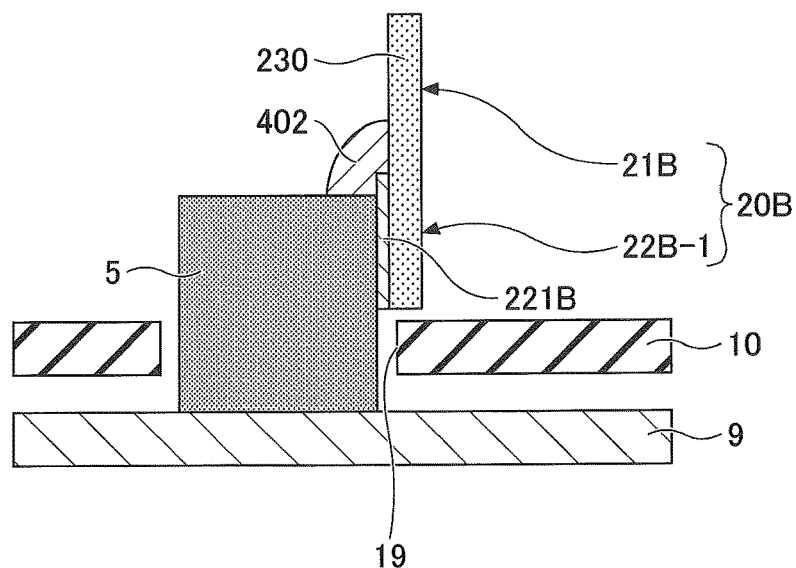
FIG. 8 is a sectional view of the plate-shaped member and the printed board in a fixed state according to the third embodiment.

As schematically illustrated in FIG. 8, the fixation part 22B-1 is soldered to the part 5 while being in contact with a side of the part 5 through the metallic pattern 221B. Solder 402 is schematically illustrated in FIG. 8. The part 5 is an example of a part that protrudes through an opening 19 in the printed board 10 as illustrated in FIG. 8.

Figure 9:
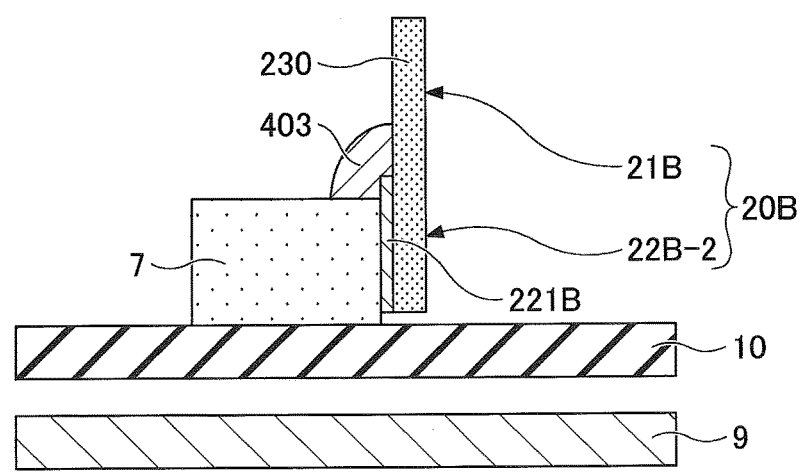
FIG. 9 is a sectional view of the plate-shaped member and the printed board in a fixed state according to the third embodiment.

As schematically illustrated in FIG. 9, the fixation part 22B-2 is soldered to the peripheral part 7 mounted on the printed board 10 while being in contact with a side of the peripheral part 7 through the metallic pattern 221B.

The same effects as achieved by the above-described first embodiment can be achieved by the third embodiment as well. According to the third embodiment, it is possible to fix the plate-shaped member 20B using existing parts (the part 5 and the peripheral part 7).

The third embodiment may be suitably combined with each of the first embodiment and the second embodiment. For example, the plate-shaped member 20 of the first embodiment may include the fixation parts 22B in addition to the fixation parts 22. In this case, the fixation parts 22 are fixed by the method according to the first embodiment and the fixation parts 22B are fixed by the method according to the third embodiment.

[d] Fourth Embodiment

Figure 10:
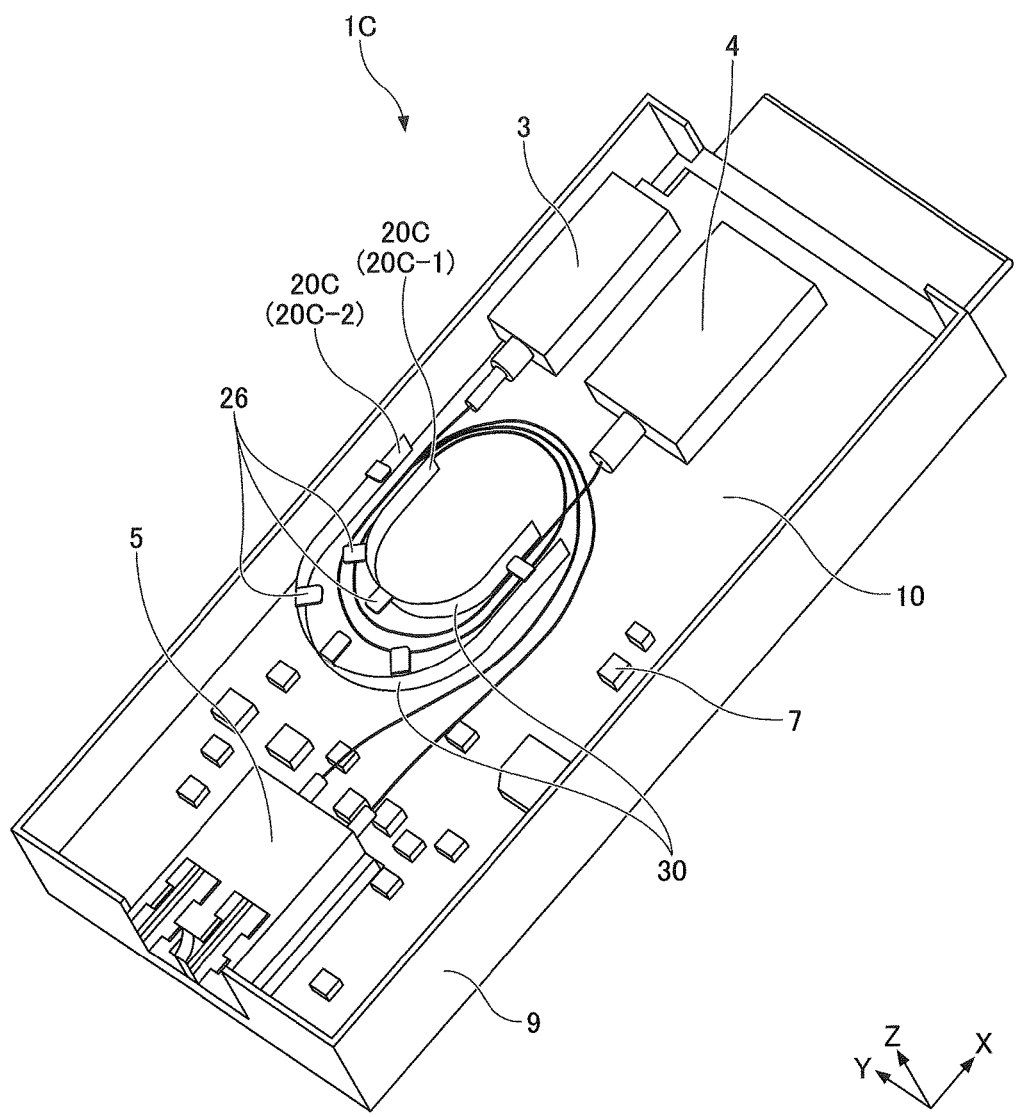
FIG. 10 is a perspective view of an optical transceiver according to a fourth embodiment, illustrating an internal structure thereof.

FIG. 10 is a perspective view of an optical transceiver 1C (an optical communications device) according to a fourth embodiment, illustrating an internal structure of the optical transceiver 1C. In FIG. 10, an upper part of a housing is not depicted to illustrate the internal structure. In FIG. 10, an X-direction, a Y-direction, and a Z-direction are illustrated as three orthogonal directions. In the following, for convenience of description, the Z-direction is regarded as an upward direction, and a side, position, object or the like that is in the Z-direction relative to another is referred to using a term associated with the upward direction, such as "upper." The optical transceiver 1C in which components are installed, however, may be in any orientation.

The optical transceiver 1C is different from the optical transceiver 1 of the first embodiment in including a plate-shaped member 20C in place of the plate-shaped member 20. In the following description of the fourth embodiment, elements that may be the same as those of the first embodiment are referred to using the same reference numerals, and their description may be omitted.

The plate-shaped member 20C is formed of an FPC the same as in the first embodiment. The plate-shaped member 20C may be provided in the form of a pair of plate-shaped members as illustrated in FIG. 10. In the following, the plate-shaped member 20C may also be referred to as "plate-shaped members 20C-1 and 20C-2" when a distinction is made between the individual plate-shaped members. As a variation, the plate-shaped member 20C-2 may be omitted.

That is, the plate-shaped member 20C may be provided only on the side on which it is possible to prevent a bend radius smaller than the minimum allowable bend radius of the optical cable 40.

The plate-shaped member 20C is different from the plate-shaped member 20 of the first embodiment in further including tabs 26. That is, the plate-shaped member 20C includes the body 21, the fixation parts 22, and the tabs 26.

The tabs 26 serve to prevent the optical cable 40 from moving out (protruding) from the upper side of the plate-shaped member 20C. That is, the tabs 26 extend in such a manner as to cover the optical cable 40 from above to prevent upward displacement of the optical cable 40. By including the tabs 26, it is possible to prevent the optical cable 40 from moving out from the upper side of the plate-shaped member 20C.

The tabs 26 of each of the plate-shaped members 20C-1 and 20C-2 extend from the upper end of the body 21. The tabs 26 of the plate-shaped member 20C-1 protrude away from the center of curvature (namely, radially outward) relative to the body 21. The tabs 26 of the plate-shaped member 20C-2 protrude toward the center of curvature (namely, radially inward) relative to the body 21. The tabs 26 may be formed by bending protrusions at the upper end of the substrate 230 radially inward or outward.

Figure 11:
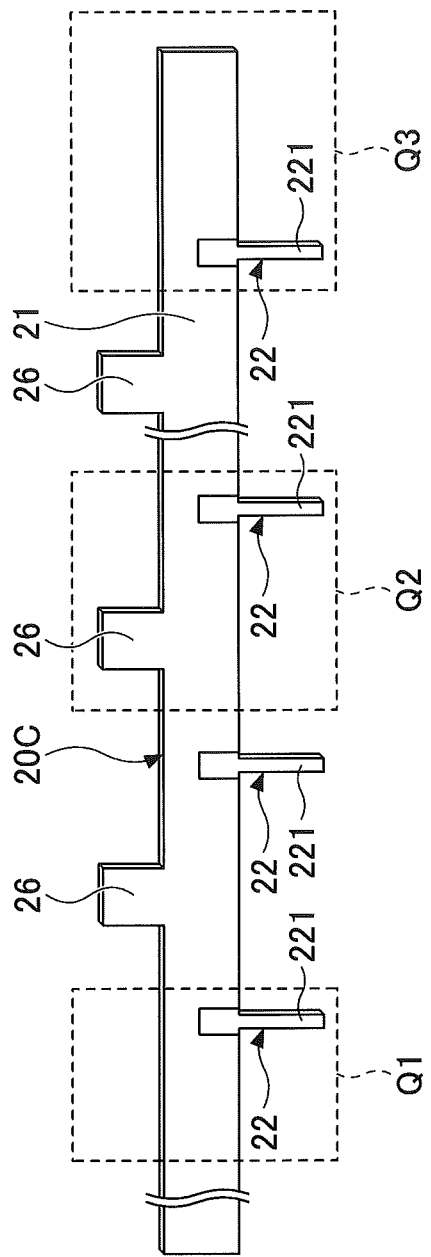
FIG. 11 is a schematic diagram illustrating a plate-shaped member in a straightened state according to the fourth embodiment.
Figure 12:
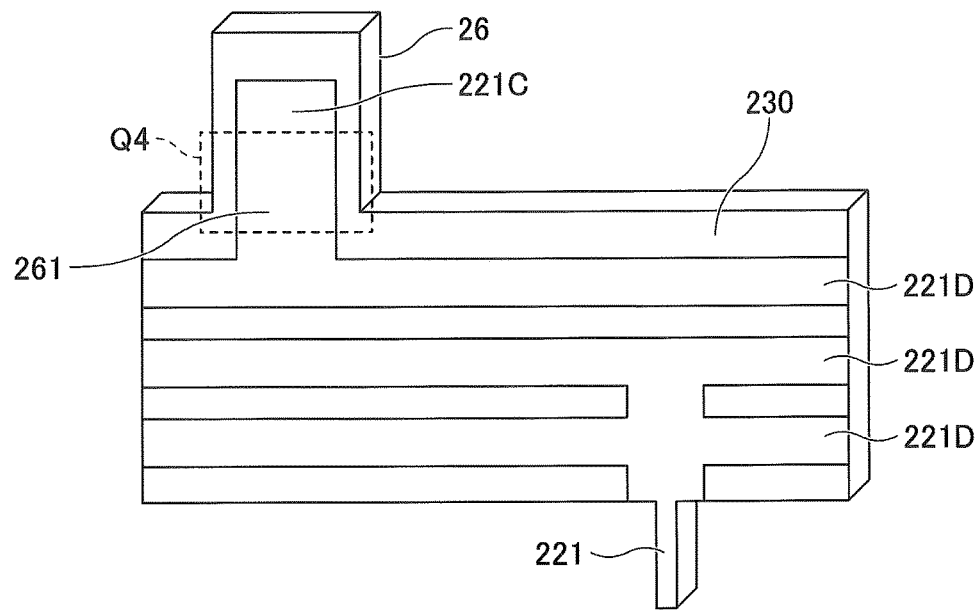
FIG. 12 is an enlarged view of part Q2 of FIG. 11.

FIG. 11 is a schematic diagram illustrating the plate-shaped member 20C in a straightened (unbent) state. In FIG. 11, the tabs 26 as well are illustrated as being unbent. FIG. 12 is an enlarged view of part Q2 of FIG. 11, depicting a metallic pattern 221C that is not depicted in FIG. 11.

The tabs 26 (hereinafter collectively referred to as "tab 26") preferably include a metallic pattern the same as the fixation parts 22. In this case, in a portion of the substrate 230 to become the tab 26, the area occupancy rate of the metallic pattern is preferably determined in view of preventing a portion bent into the tab 26 from opening up to return to its original sheet shape. For example, referring to FIG. 12, in a region to be bent between the tab 26 and the body 21 (see part Q4), the area occupancy rate of the metallic pattern is higher than in other regions of the body 21. In this case, the metallic pattern may be formed on only part or the entirety of the tab 26. In the illustration of FIG. 11, the metallic pattern 221c is formed over a large part of the tab 26 to extend onto the body 21 from the tab 26.

Next, preferable formation patterns of metallic patterns in a general portion of the body 21 (see part Q1 of FIG. 11) are described with reference to FIGS. 13 through 15. The below-described formation patterns may also be applied to the above-described first through third embodiments. The general portion of the body 21 refers to a portion that is not a longitudinal end and near which the tab 26 is not formed.

Figure 13:
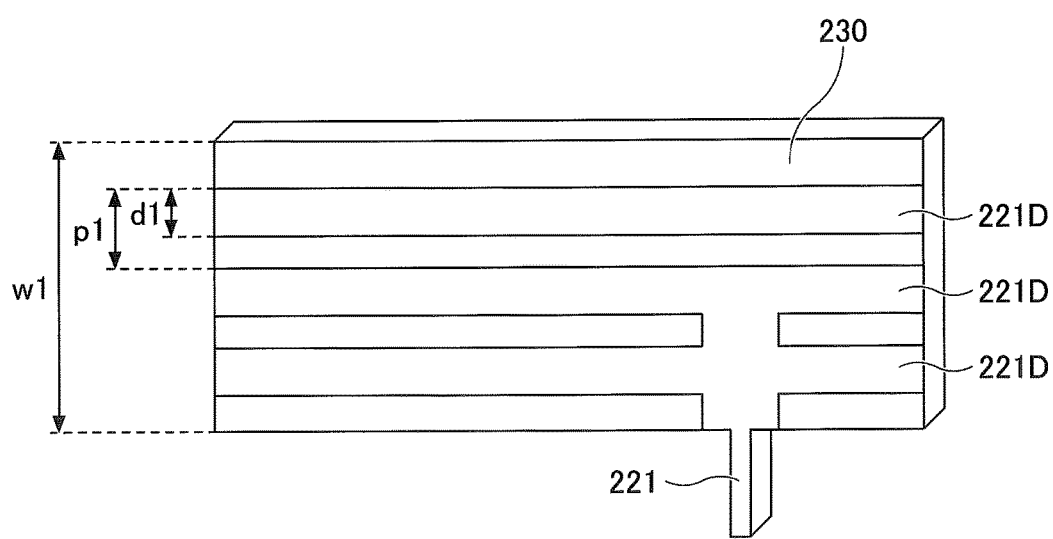
FIG. 13 is a diagram illustrating a formation pattern of metallic patterns in a general portion of a body.

In the illustration of FIG. 13, multiple metallic patterns 221D extending parallel to a longitudinal direction of the body 21 are formed in the general portion of the body 21. The metallic patterns 221D have a predetermined width d1. The metallic patterns 221D are vertically spaced with a predetermined vertical pitch p1 to form a stripe pattern. In this case, by adjusting a width w1 of the body 21 and the width d1 and the pitch p1 of the metallic patterns 221D, it is possible to adjust the elastic properties of the general portion of the body 21.

Figure 14:
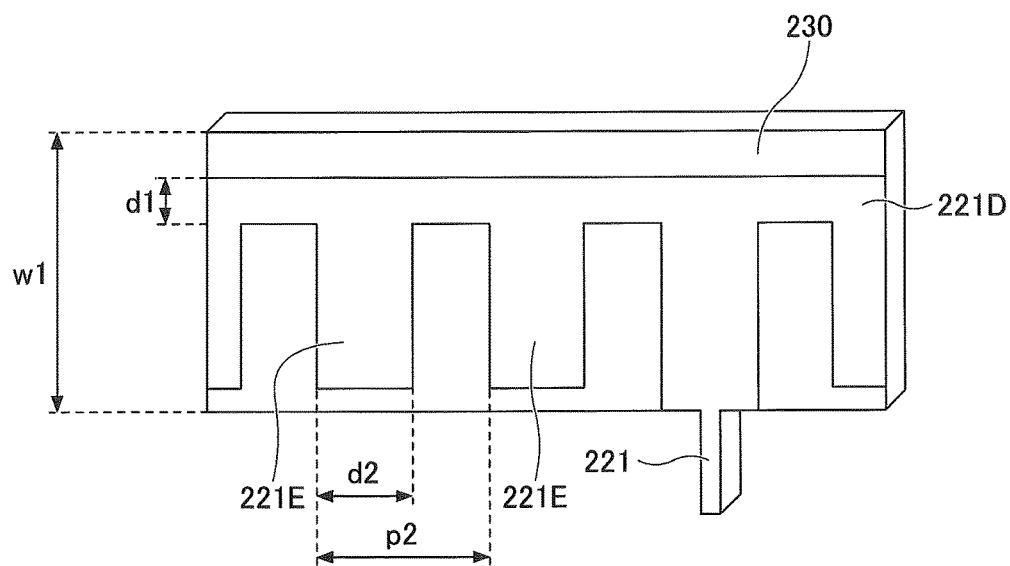
FIG. 14 is a diagram illustrating another formation pattern of metallic patterns in the general portion of the body.

In the illustration of FIG. 14, the metallic pattern 221D extending parallel to a longitudinal direction of the body 21 and multiple metallic patterns 221E vertically extending parallel to one another are formed in the general portion of the body 21. The metallic patterns 221E have a predetermined width d2. The metallic patterns 221E are horizontally spaced (namely, spaced in the longitudinal direction of the body 21) with a predetermined horizontal pitch p2 to form a stripe pattern. In this case, by adjusting the width w1 of the body 21, the width d1 of the metallic pattern 221D, and the width d2 and the pitch p2 of the metallic patterns 221E, it is possible to adjust the elastic properties of the general portion of the body 21.

Figure 15:
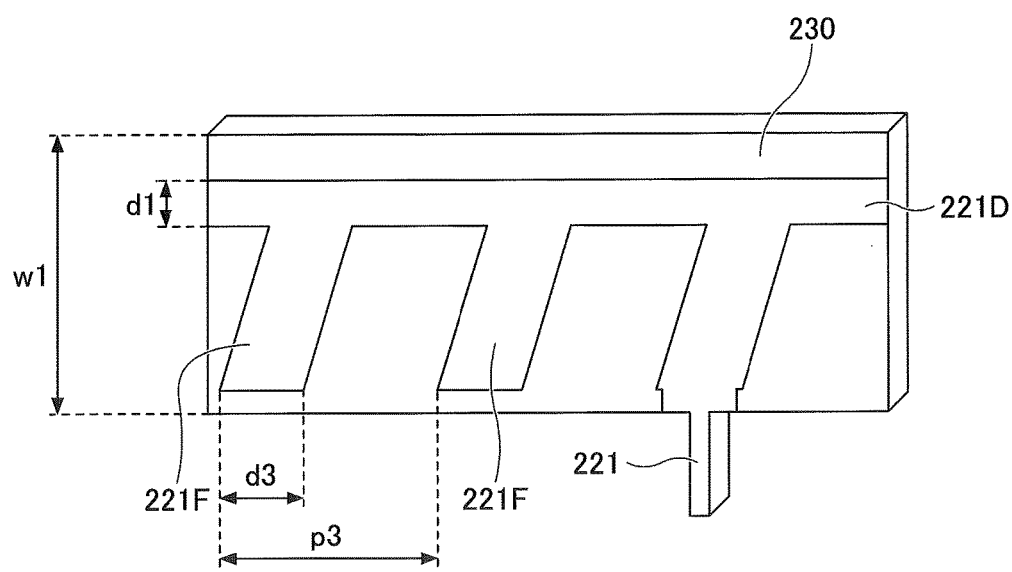
FIG. 15 is a diagram illustrating yet another formation pattern of metallic patterns in the general portion of the body.

In the illustration of FIG. 15, the metallic pattern 221D extending parallel to a longitudinal direction of the body 21 and multiple metallic patterns 221F extending at an angle to a vertical direction of the body 21 are formed in the general portion of the body 21. The metallic patterns 221F have a predetermined width d3. The metallic patterns 221F are horizontally spaced with a predetermined horizontal pitch p3 to form a stripe pattern. In this case, by adjusting the width w1 of the body 21, the width d1 of the metallic pattern 221D, and the width d3 and the pitch p3 of the metallic patterns 221F, it is possible to adjust the elastic properties of the general portion of the body 21.

As illustrated in FIGS. 13 through 15, the pattern shape and the size of metallic patterns can be optimized in accordance with the design bend radius of the optical cable 40. In addition, by changing the direction of the stripes of patterns, it is possible to provide elastic properties with directivity. This makes it possible to optimize the elastic properties of the body 21 in accordance with a forming direction (a direction in which the optical cable 40 is wound).

Next, a preferable formation pattern of metallic patterns at a longitudinal end of the body 21 and in its adjacent portion (see part Q3 of FIG. 11) is described with reference to FIG. 16. The below-described formation pattern may also be applied to the above-described first through third embodiments.

Figure 16:
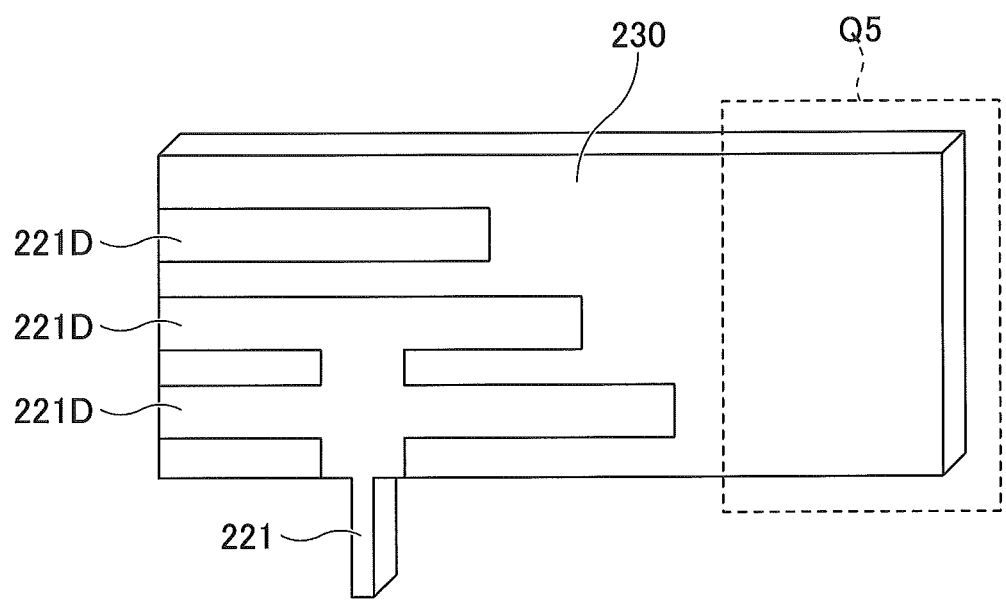
FIG. 16 is a diagram illustrating a formation pattern of metallic patterns at an end of the body.

In the illustration of FIG. 16, the metallic patterns 221D end without reaching an end of the body 21 (see part Q5 of FIG. 16). That is, there is a region where no metallic patterns are formed at the end of the body 21. A workload is likely to be imposed on the end of the body 21 during fiber forming. Accordingly, the end of the body 21 is preferably formed such that the area occupancy rate of metallic patterns is relatively low, so as to return to its original shape even when deformed. That is, preferably, the area occupancy rate of metallic patterns is lowered at the end of the body 21 to provide the end with shape recovery characteristics. Furthermore, because the optical cable 40 is likely to contact the end of the body 21, it is possible to minimize damage to the optical cable 40 caused by the contact by lowering the area occupancy rate of metallic patterns. That is, at the end of the body 21, no metallic patterns are exposed and only the substrate 230 (a resin part) of relatively low hardness extends, so that it is possible to minimize damage to the optical cable 40 caused by contact with the end. The same applies to the longitudinal end of the body 21 opposite to the longitudinal end illustrated in FIG. 16.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, while the above-described first through fourth embodiments are illustrated using the case of forming the optical cable 40 inside an optical module such as the optical transceiver 1 as an example, embodiments may be applied not only to optical modules for internal mounting but also to any optical product (electronic device) incorporating an optical part or component with an optical cable (optical fiber).

What is claimed is:

1. An optical communications device comprising:
    a support;
    a plate-shaped member supported in a curved state on the support, the plate-shaped member being a flexible printed circuit including a flexible substrate and a metallic pattern formed on the flexible substrate; and
    an optical cable provided along a curved surface of the plate-shaped member on the support.

2. The optical communications device as claimed in claim 1, wherein the plate-shaped member does not form an electrical circuit.

3. The optical communications device as claimed in claim 1, wherein
    the plate-shaped member includes
        a body forming the curved surface; and
        a plurality of fixation parts extending from the body and soldered to the support, and
    the plurality of fixation parts are provided one at each of a plurality of positions along a longitudinal direction of the plate-shaped member.

4. The optical communications device as claimed in claim 3, wherein the metallic pattern is formed on a portion of the substrate serving as the plurality of fixation parts.

5. The optical communications device as claimed in claim 4, wherein
    the support is a printed board,
    the printed board includes a plurality of fixation pads provided one at each of multiple positions along an arc corresponding to the curved surface, and
    the plurality of fixation parts are provided one at each of the plurality of positions corresponding to the plurality of fixation pads.

6. The optical communications device as claimed in claim 4, wherein
    the support is a printed board,
    the printed board includes a plurality of holes provided one at each of multiple positions along an arc corresponding to the curved surface, and
    the plurality of fixation parts are provided one at each of the plurality of positions corresponding to the plurality of holes, and are protrusions fitted into the plurality of holes.

7. The optical communications device as claimed in claim 4, wherein
    the support is a printed board, and
    at least one of the plurality of fixation parts is soldered to a part mounted on the printed board.

8. The optical communications device as claimed in claim 4, wherein
    the support is a printed board including an opening, and
    at least one of the plurality of fixation parts is soldered to a part protruding through the opening.

9. The optical communications device as claimed in claim 4, wherein
    the plate-shaped member includes a tab extending from an end of the body facing away from the support, the tab protruding toward or away from a center of curvature of the curved surface relative to the body, and the metallic pattern is formed on a portion of the substrate serving as the tab.

10. The optical communications device as claimed in claim 9, wherein an area occupancy rate of the metallic pattern on the substrate is higher in a bent region between the tab and the body than in another region of the body.

11. The optical communications device as claimed in claim 4, wherein the metallic pattern forms a stripe pattern in a portion of the substrate serving as the body.

* * * * *